United States Patent [19]
Casey et al.

[11] Patent Number: 5,682,589
[45] Date of Patent: Oct. 28, 1997

[54] ALUMINUM NITRIDE BODY HAVING GRADED METALLURGY

[75] Inventors: Jon Alfred Casey, Poughkeepsie; Carla Natalia Cordero, Wappingers Falls; Benjamin Vito Fasano, New Windsor; David Brian Goland, Croton; Robert Hannon, Wappingers Falls, all of N.Y.; Jonathan H. Harris, Scotsdale, Ariz.; Lester Wynn Herron, Hopewell Junction, N.Y.; Gregory Marvin Johnson, Poughkeepsie, N.Y.; Niranjan Mohanlal Patel, Wappingers Falls, N.Y.; Andrew Michael Reitter, Poughkeepsie, N.Y.; Subhash Laxman Shinde, Croton-on-Hudson, N.Y.; Rao Venkateswara Vallabhaneni, Wappingers Falls, N.Y.; Robert A. Youngman, Paradise Valley, Ariz.

[73] Assignee: International Business Machines Corporation, Armonk, N.Y.

[21] Appl. No.: 657,258

[22] Filed: Jun. 3, 1996

Related U.S. Application Data

[62] Division of Ser. No. 437,494, May 9, 1995, Pat. No. 5,552,107, which is a division of Ser. No. 361,351, Dec. 21, 1994, Pat. No. 5,552,232.

[51] Int. Cl.$^6$ .................................................. B22F 1/00
[52] U.S. Cl. ........................................................ 419/13
[58] Field of Search .......................... 419/13, 9; 156/48; 264/61

[56] References Cited

U.S. PATENT DOCUMENTS

| | | | |
|---|---|---|---|
| 4,299,873 | 11/1981 | Ogihara et al. | 428/137 |
| 4,695,517 | 9/1987 | Okano et al. | 428/698 |
| 4,770,953 | 9/1988 | Horiguchi et al. | 428/698 |
| 4,800,137 | 1/1989 | Okano et al. | 428/698 |
| 4,840,853 | 6/1989 | Iio et al. | 428/698 |
| 4,861,641 | 8/1989 | Foster et al. | 428/137 |
| 4,892,703 | 1/1990 | Iio et al. | 419/13 |
| 4,942,076 | 7/1990 | Panicker et al. | 428/137 |
| 4,980,239 | 12/1990 | Harada et al. | 428/552 |
| 5,019,187 | 5/1991 | Iyogi et al. | 148/24 |
| 5,063,121 | 11/1991 | Sato et al. | 428/698 |
| 5,089,881 | 2/1992 | Panicker | 357/80 |
| 5,096,749 | 3/1992 | Harada et al. | 427/404 |
| 5,200,249 | 4/1993 | Dolhert et al. | 428/137 |
| 5,229,213 | 7/1993 | Horiuchi et al. | 428/457 |
| 5,260,519 | 11/1993 | Knickerbocker et al. | 174/262 |
| 5,290,375 | 3/1994 | Nagasaka et al. | 156/89 |
| 5,336,928 | 8/1994 | Neugebauer | 257/758 |
| 5,340,947 | 8/1994 | Credle et al. | 174/262 |
| 5,424,261 | 6/1995 | Harris et al. | 501/96 |
| 5,482,903 | 1/1996 | Duncombe et al. | 501/32 |

FOREIGN PATENT DOCUMENTS 0 574 956 A1  12/1993  European Pat. Off. ........ C04B 41/51

*Primary Examiner*—Charles T. Jordan
*Assistant Examiner*—Anthony R. Chi
*Attorney, Agent, or Firm*—Ira D. Blecker

[57] ABSTRACT

Disclosed is an aluminum nitride body having graded metallurgy and a method for making such a body. The aluminum nitride body has at least one via and includes a first layer in direct contact with the aluminum nitride body and a second layer in direct contact with, and that completely encapsulates, the first layer. The first layer includes 30 to 60 volume percent aluminum nitride and 40 to 70 volume percent tungsten and/or molybdenum while the second layer includes 90 to 100 volume percent of tungsten and/or molybdenum and 0 to 10 volume percent of aluminum nitride.

12 Claims, 1 Drawing Sheet

ALUMINUM NITRIDE BODY HAVING GRADED METALLURGY

RELATED APPLICATION

This application is a divisional of U.S. patent application Ser. No. 08/437,494 filed on May 9, 1995 now U.S. Pat. No. 5,552,108 which is a divisional of U.S. patent application Ser. No. 08/361,351 filed on Dec. 21, 1994 U.S. Pat. No. 5,552,232, and both of which are assigned to the assignee of the present invention.

BACKGROUND OF THE INVENTION

This invention relates to an aluminum nitride body and the method of producing such a body and, more particularly, relates to an aluminum nitride body having features and vias which have a graded metallurgy structure and to a method for producing such an aluminum nitride body.

Aluminum nitride has been of interest recently for electronic packaging applications because of its high thermal conductivity, thermal expansion matching with silicon, low dielectric constant (8.5) and high electrical resistivity.

The present invention is particularly suitable for co-fired electronic packages, also known as substrates. In one co-firing process, the aluminum nitride is formed into greensheets (comprised of aluminum nitride particles in an organic binder), vias are punched, metallization paste (comprised of metallic particles in an organic binder) is screened or extruded onto the greensheets and into the vias, the greensheets are stacked and laminated to form a substrate in the green state, and then the green substrate is sintered to densify the aluminum nitride layers and the metallization. "Co-fired" means that the metallic paste is sintered during the same sintering schedule as the aluminum nitride body. The metallization for aluminum nitride substrates is typically tungsten but may also be molybdenum or a mixture of tungsten and molybdenum. In addition, instead of forming the aluminum nitride body by using greensheets, dry pressing may be used to form the aluminum nitride body.

The co-firing of aluminum nitride substrates with tungsten metallurgy requires matching of the sintering behavior of aluminum nitride and tungsten. This can be achieved by introducing various sintering additives to the aluminum nitride and tungsten powders. Generally, the tungsten powder shows sintering onset at a lower temperature compared to aluminum nitride and hence the sintering additives added to tungsten retard the onset of tungsten sintering. The sintering additives may also reduce the final sintered density of tungsten, possibly resulting in porous tungsten. This type of metallurgy, though useful for internal metallization, cannot be used to produce input/output (I/O) pads or surface metallization due to its porous nature. Use of porous metallization results in a non-hermetic substrate which is undesirable because any wet processing subsequent to the formation of the I/O pads will allow liquids to penetrate within the substrate which can degrade the manufacturability and performance of the substrate. Use of pure tungsten powder that will sinter to high density (and therefore be hermetic) for external metallization results in early sintering of tungsten, leading to debonding at the aluminum nitride/ tungsten interface before the aluminum nitride sinters to full density, giving very low adhesion strength.

The solution to this dilemma involves addressing two problems that are interdependent, namely, shrinkage matching of tungsten metallization to that of aluminum nitride during co-firing by choosing the right sintering additives and ensuring that fully dense tungsten results notwithstanding the presence of sintering additives that retard the sintering of tungsten.

Thus far, this solution remains unfulfilled.

Okano et al. U.S. Pat. Nos. 4,695,517 and 4,800,137, the disclosures of which are incorporated by reference herein, have proposed a composite layer on an aluminum nitride body in an effort to increase the bond strength between the aluminum nitride body and the metallization. Okano et al. propose overlapped layers on the aluminum nitride body of tungsten (or molybdenum) plus aluminum nitride followed by a layer of tungsten (or molybdenum). Okano et al. do not appear to appreciate that the first layer may be porous, thereby necessitating that it be compensated for lest a non-hermetic substrate should result. Even if the first layer of tungsten (or molybdenum) plus aluminum nitride is nonporous, it must be completely covered by the overlying layer of tungsten (or molybdenum) because any subsequent plating will not adhere well to the first layer, resulting in damage to the entire plated layer. A plated layer is usually disposed over the tungsten (or molybdenum) layer in order to facilitate I/O pin or wire bonding.

Sato et al. European Patent Application 0 574 956, the disclosure of which is incorporated by reference herein, propose an intermediate co-fired layer of tungsten or molybdenum plus titanium nitride followed by metallization such as by nickel plating.

Harada et al. U.S. Pat. Nos. 4,980,239 and 5,096,749, the disclosures of which are incorporated by reference herein, discloses a composite layer structure on an aluminum nitride substrate comprising sequential thin film layers of titanium, tungsten or molybdenum, and nickel. Thereafter, the composite structure is heated to a temperature high enough to cause a reaction between the titanium layer and the aluminum nitride body, resulting in an intermediate layer of aluminum titanium nitride which improves the adhesion of the metallization.

Iio et al. U.S. Pat. Nos. 4,840,853 and 4,892,703, the disclosures of which are incorporated by reference herein, propose an aluminum nitride body having an intermediate layer comprising aluminum, nitrogen and oxygen, and a metallized layer of tungsten or molybdenum. The intermediate layer is necessary to increase the bonding strength of the metallized layer. It is not clear from the description how this structure is formed.

The internal vias of the substrate present a different problem. Pure tungsten or molybdenum will not adhere well to the walls of the vias. So-called "rattling vias" may be obtained where the metallic via floats within the via opening which may result in cracking around vias. Accordingly, the present inventors have recognized that a graded metallurgy may be useful for the internal vias.

Knickerbocker et al. U.S. Pat. No. 5,260,519, the disclosure of which is incorporated by reference herein, discloses a multiple layer/via structure wherein the composition of the vias in different layers is graded from metallic to a mixture of ceramic and metal. There is no teaching of grading the via composition in a single via opening.

Dolhert, et al., U.S. Pat. No. 5,200,249, the disclosure of which is incorporated by reference herein, discloses an hermetic via composition for an aluminum nitride substrate consisting of a mixture of aluminum, nitride and tungsten or molybdenum.

Panicker, et al., U.S. Pat. No. 4,942,076, the disclosure of which is incorporated by reference herein, discloses a composite via composition for an alumina substrate. The substrate is sintered with tungsten paste which forms a porous via. Copper is later infiltrated into the porous tungsten.

In view of the above attempts at composite and graded structures, it is a purpose of the present invention to have a metallurgical structure with good adhesion strength to accommodate the bonding of I/O pins and wire bonds.

It is another purpose of the present invention to have a metallurgical structure that is hermetic with respect to the ambient environment.

It is yet another purpose of the present invention to have a metallurgical structure that is particularly useful for making composite vias.

These and other purposes of the invention will become more apparent after referring to the following description in conjunction with the accompanying drawings.

BRIEF SUMMARY OF THE INVENTION

According to a first aspect of the invention, there is proposed an aluminum nitride sintered body having graded metallurgy comprising:

an aluminum nitride sintered body having at least one via therein; and graded metallurgy on said sintered body and in direct contact with said at least one via, said graded metallurgy comprising a first layer of metallurgy in direct contact with said sintered body and a second layer of metallurgy in direct contact with, and that completely encapsulates, said first layer of metallurgy;

said first layer of metallurgy comprising 30 to 60 volume percent aluminum nitride and 40 to 70 volume percent of a metal selected from the group consisting of tungsten, molybdenum and mixtures thereof;

said second layer of metallurgy comprising 90 to 100 volume percent of a metal selected from the group consisting of tungsten, molybdenum and mixtures thereof and 0 to 10 volume percent of aluminum nitride.

According to a second aspect of the invention, there is proposed an aluminum nitride sintered body having graded metallurgy comprising:

an aluminum nitride sintered body having at least one via therein;

said at least one via being filled with graded metallurgy, said graded metallurgy comprising a first layer of metallurgy adhered to the walls of said at least one via but leaving a central portion of said at least one via devoid of said first layer of metallurgy and a second layer of metallurgy filling the central portion of said at least one via;

said first layer of metallurgy comprising 30 to 60 volume percent aluminum nitride and 40 to 70 volume percent of a metal selected from the group consisting of tungsten, molybdenum and mixtures thereof;

said second layer of metallurgy comprising 90 to 100 volume percent of a metal selected from the group consisting of tungsten, molybdenum and mixtures thereof and 0 to 10 volume percent of aluminum nitride.

According to a third aspect of the invention, there is proposed a method for producing an aluminum nitride sintered body having graded metallurgy comprising the steps of:

providing an aluminum nitride unsintered body having at least one via therein;

forming a first layer of metallurgy paste proximate to said at least one via and in direct contact with said aluminum nitride body, said first layer of metallurgy paste comprising, based on the solids content of said paste, 30 to 60 volume percent aluminum nitride and 40 to 70 volume percent of a metal selected from the group consisting of tungsten, molybdenum and mixtures thereof;

forming a second layer of metallurgy paste in direct contact with, and that completely encapsulates, said first layer of metallurgy paste, said second layer of metallurgy paste, based on the solids content of said paste, comprising 90 to 100 volume percent of a metal selected from the group consisting of tungsten, molybdenum and mixtures thereof and 0 to 10 volume percent of aluminum nitride; and sintering said aluminum nitride body and said first and second layers of metallurgy paste at a predetermined time and temperature to form a fully dense aluminum nitride sintered body having first and second layers of graded metallurgy wherein said second layer of metallurgy completely encapsulates said first layer of metallurgy and wherein said graded metallurgy is in contact with said at least one via.

According to a fourth aspect of the invention, there is proposed a method for producing an aluminum nitride sintered body having graded metallurgy comprising:

providing an aluminum nitride sintered body having at least one via therein;

filling said at least one via with graded metallurgy paste, said graded metallurgy paste comprising a first layer of metallurgy paste adhered to the walls of said at least one via but leaving a central portion of said at least one via devoid of said first layer of metallurgy paste and a second layer of metallurgy paste filling the central portion of said at least one via;

said first layer of metallurgy paste comprising 30 to 60 volume percent aluminum nitride and 40 to 70 volume percent of a metal selected from the group consisting of tungsten, molybdenum and mixtures thereof;

said second layer of metallurgy paste comprising 90 to 100 volume percent of a metal selected from the group consisting of tungsten, molybdenum and mixtures thereof and 0 to 10 volume percent of aluminum nitride; and sintering said aluminum nitride body and first and second layers of metallurgy paste at a predetermined time and temperature to form a fully dense aluminum nitride sintered body having at least one via therein with first and second layers of graded metallurgy.

According to a fifth aspect of the invention, there is proposed a multilayered aluminum nitride sintered body comprising:

at least two sintered layers of aluminum nitride;

at least one metallurgical feature situated between said at least two sintered layers of aluminum nitride, said metallurgical feature comprising 30 to 60 volume percent aluminum nitride and 40 to 70 volume percent of a metal selected from the group consisting of tungsten and molybdenum and mixtures thereof.

According to a sixth aspect of the invention, there is proposed a co-fired aluminum nitride sintered body having adherent graded metallurgy comprising:

an aluminum nitride sintered body; and graded metallurgy on, and in direct contact with, said sintered body, said graded metallurgy comprising a first layer of metallurgy in direct contact with said sintered body and a second layer of metallurgy in direct contact with, and that completely encapsulates, said first layer of metallurgy;

said first layer of metallurgy comprising 30 to 60 volume percent aluminum nitride and 40 to 70 volume percent of a metal selected from the group consisting of tungsten, molybdenum and mixtures thereof;

said second layer of metallurgy comprising 90 to 100 volume percent of a metal selected from the group consisting of tungsten, molybdenum and mixtures thereof and 0 to 10 volume percent of aluminum nitride.

According to a seventh aspect of the invention, there is proposed a method for producing a co-fired aluminum nitride sintered body having adherent graded metallurgy comprising the steps of:

providing an aluminum nitride unsintered body;

forming a first layer of metallurgy paste in direct contact with said aluminum nitride body, said first layer of metallurgy paste comprising, based on the solids content of said paste, 30 to 60 volume percent aluminum nitride and 40 to 70 volume percent of a metal selected from the group consisting of tungsten, molybdenum and mixtures thereof;

forming a second layer of metallurgy paste in direct contact with, and that completely encapsulates, said first layer of metallurgy paste, said second layer of metallurgy paste, based on the solids content of said paste, comprising 90 to 100 volume percent of a metal selected from the group consisting of tungsten, molybdenum, and mixtures thereof, and 0 to 10 volume percent of aluminum nitride; and sintering said aluminum nitride body and said first and second layers of metallurgy paste at a predetermined time and temperature to form a fully dense co-fired aluminum nitride sintered body having first and second layers of graded metallurgy wherein said second layer of metallurgy completely encapsulates said first layer of metallurgy and wherein said graded metallurgy is in direct contact with, and adherent to, said aluminum nitride sintered body.

DETAILED DESCRIPTION OF THE INVENTION

Figure 1:
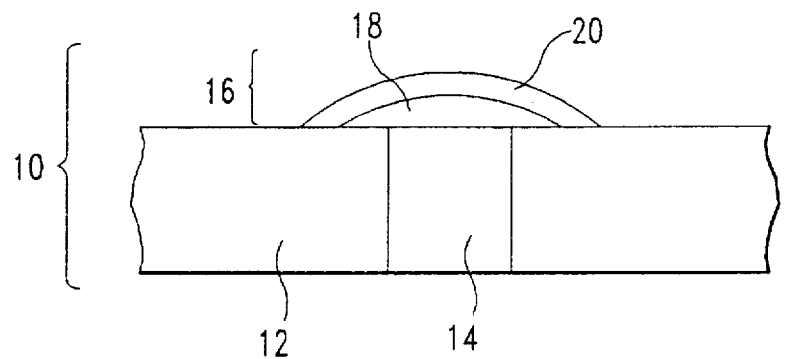
FIG. 1 is a cross-sectional view of an embodiment of the invention wherein an aluminum nitride sintered body has graded metallurgy for an I/O pad and the bottom layer is in contact with the via.

Referring to the Figures in more detail, and particularly referring to FIG. 1, disclosed according to the invention is an aluminum nitride body having graded metallurgy, generally indicated by 10 in FIG. 1. Aluminum nitride sintered body 12 has at least one via 14 in the body. The composition of this particular via 14 is not important to this aspect of the invention. Typically however, via 14 usually comprises tungsten, molybdenum or mixtures of tungsten and molybdenum and may also include certain sintering additives, such as calcia, alumina, or yttria, to achieve densification of the via.

Situated on aluminum nitride sintered body 12 is graded metallurgy 16 which is also positioned to be in contact with via 14. As shown in FIG. 1, graded metallurgy 16 comprises a first layer of metallurgy 18 which is in direct contact with the aluminum nitride sintered body 12 and via 14 and a second layer of metallurgy 20 that is in direct contact with the first layer of metallurgy 18. Second layer of metallurgy 20 also completely encapsulates first layer of metallurgy 18.

The first layer of metallurgy comprises 30 to 60 volume percent aluminum nitride and 40 to 70 volume percent of tungsten or molybdenum or a mixture of tungsten and molybdenum, preferably tungsten. It is believed that a minimum of 30 volume percent of aluminum nitride is necessary for good bonding. This belief is based on a metallographic evaluation of the interface between the aluminum nitride sintered body and the first layer of metallurgy 18 where an abrupt interface is shown. Lesser amounts of aluminum nitride in the first layer of metallurgy 18 would probably reduce the integrity of this interface. On the other hand, a metallographic evaluation of the interface for 60 volume percent aluminum nitride in the first layer of metallurgy 18 showed a very diffuse interface, thereby indicating the likelihood of good bonding. However, more than 60 volume percent aluminum nitride in the first layer of metallurgy 18 is discouraged as conductivity and adhesion to the second layer of metallurgy 20 become impaired. The most preferred amount of aluminum nitride is about 55 volume percent which provides the right balance of adhesion and conductivity. In addition, the first layer of metallurgy may contain sintering aids such as yttria or calcia to assist in densification, if desired.

The second layer of metallurgy 20 comprises 90 to 100 volume percent of tungsten or molybdenum or a mixture of tungsten and molybdenum, with tungsten being preferred, and 0 to 10 volume percent aluminum nitride. Small amounts of aluminum nitride may be added to the metal to marginally increase the adhesion of the second layer of metallurgy 20 to the first layer of metallurgy 18. It is preferred that the second layer of metallurgy 20 be 100 volume percent tungsten. In any event, the second layer of metallurgy 20 sinters to a substantially pore-free state which is hermetic.

The graded metallurgy 16 is typically used for I/O or wire bond pads. As such, the graded metallurgy 16 may be plated with a metal such as nickel to facilitate soldering or brazing of the wire or pins to the bond pad. In its most general aspect, the present invention may be used to form adherent, graded metallurgy on a sintered aluminum nitride sintered body for seal bands, lands for attachment of lead frames and surface metallization. In the latter uses, a via may not be present or electrically connected to the graded metallurgy. Even here though, the graded metallurgy 16 will usually be plated.

It is important to the present invention that the first layer of metallurgy 18 is completely encapsulated by the second layer of metallurgy 20. There are two reasons for this. The first reason is that first layer of metallurgy may be porous which can occur if sintering aids are not added to the first layer of metallurgy 18 during sintering. During further processing of the sintered aluminum nitride body, which can include wet processing for plating, moisture or liquids can seep into the first layer of metallurgy if it is porous and then further seep into the rest of the substrate since the via is often porous. This presents a manufacturability as well as a reliability problem. The second reason (whether or not the first layer is porous) is that the graded metallurgy is typically plated to enhance solderability or brazeability. Plating will not adhere well to the first layer of metallurgy 18. And, if even a small part of the first layer of metallurgy is exposed to the plating, the integrity of the entire plated layer can be adversely impacted. Thus, second layer of metallurgy 20 must completely encapsulate first layer of metallurgy 18.

Figure 2:
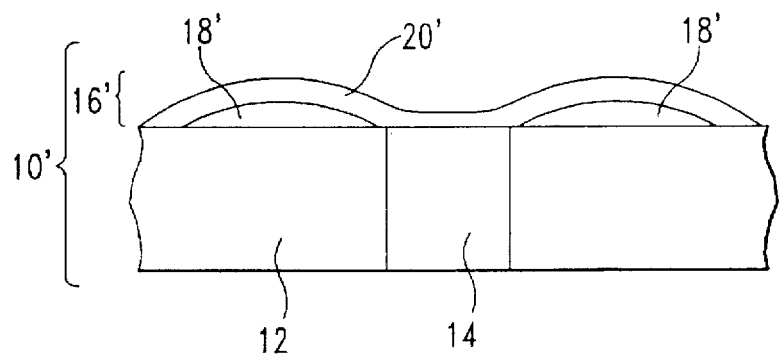
FIG. 2 is a cross-sectional view of another embodiment of the invention wherein an aluminum nitride sintered body has graded metallurgy for an I/O pad and the top layer is in contact with the via.

Referring now to FIG. 2, there is an alternative embodiment of the present invention. As in FIG. 1, there is an aluminum nitride sintered body having graded metallurgy, generally indicated by 10'. Graded metallurgy 16' comprises first layer of metallurgy 18' and second layer of metallurgy 20'. First layer of metallurgy 18' is in direct contact with aluminum nitride sintered body 12 but in this particular embodiment does not contact via 14. First layer of metallurgy 18' may be pictured as being donut-shaped with via 14 being in the "hole" of the donut. Then, second layer of metallurgy 20' is positioned over, and is in direct contact with, via 14. Second layer of metallurgy 20' also completely encapsulates first layer of metallurgy 18' for the same reasons as stated before. The advantage to this embodiment of the invention is that higher conductivity second layer of metallurgy 20' is in direct contact with via 14 and yet adhesion of the second layer of metallurgy 20' is still provided by the first layer of metallurgy 18'.

The embodiments of FIGS. 1 and 2 may be made by the following procedure. An unsintered aluminum nitride body is provided, which may be monolithic or multilayered. Then, a first layer of metallurgy paste is deposited on the unsintered aluminum nitride body and proximate to the unsintered via. (When used for seal bands and the like, the graded metallurgy may be formed away from the via. In this case, the requirement is for the graded metallurgy to be formed directly on the unsintered aluminum nitride body.) As is well known in the art, the metallurgy paste comprises metallic particles, a binder, solvent, plasticizer, and other organic additives. After deposition of the metallurgy paste and followed by sintering, the solvent and organic materials are removed from the paste and the remaining metallic particles densify into a layer of metallurgy. As used herein, the term "proximate" shall mean on or near the via. Thus, the first layer of metallurgy paste may be deposited directly on the via, to result in the structure shown in FIG. 1, or around the via (but not in direct contact with the via), to result in the structure as shown in FIG. 2. The first layer of metallurgy paste comprises 30 to 60 volume percent aluminum nitride and 40 to 70 volume percent of tungsten or molybdenum or a mixture of tungsten and molybdenum, preferably tungsten, based on the solids content of the paste, that is, excluding the solvent, binder, and other organic additives.

In addition, the first layer of metallurgy paste may contain sintering aids, as mentioned earlier. Some of these sintering aids may include, for example, yttria and calcia, as is well known to those skilled in the art. The preferred sintering aids are either a mixture of calcia-alumina-boria as disclosed in Duncombe et al. U.S. patent application Ser. No. 08/173,293 or yttria plus calcia-alumina-boria as disclosed in Harris et al. U.S. patent application Ser. No. 08/172,032, the disclosures of both of which are incorporated by reference herein.

Second layer of metallurgy paste is then deposited over, and completely encapsulates, the first layer of metallurgy paste. The composition of the second layer of metallurgy paste comprises 90 to 100 volume percent of tungsten or molybdenum or a mixture of tungsten and molybdenum, preferably tungsten, and 0 to 10 volume percent of aluminum nitride, based on the solids content of the paste. As before, these volume fractions exclude the solvent, binder and other organic additives. Depending on whether the FIG. 1 or FIG. 2 embodiment is to be formed, the second layer of metallurgy paste may or may not be in direct contact with the via.

Then, the unsintered aluminum nitride body and the first and second layers of metallurgy paste are sintered (co-fired) at a predetermined time and temperature to form a fully dense aluminum nitride sintered body with first and second layers of adherent metallurgy. The graded metallurgy so formed is positioned so as to be in direct contact with via 14 of sintered aluminum nitride body 12.

The sintering schedule may be conveniently chosen by those skilled in the art to achieve the desired microstructure and physical properties. Generally speaking, the aluminum nitride body may be sintered in a conventional furnace so long as there is a protective atmosphere. A preferred atmosphere is forming gas which is a mixture of nitrogen and hydrogen gases. The temperature is ramped up to about 600 degrees Centigrade to pyrolyze the binder. Then, the temperature is slowly ramped up to the sintering temperature of about 1550 to 1650 degrees Centigrade and held there for a period of time to accomplish binder burnoff and densification. Finally, the temperature is ramped down to room temperature.

Figure 3:
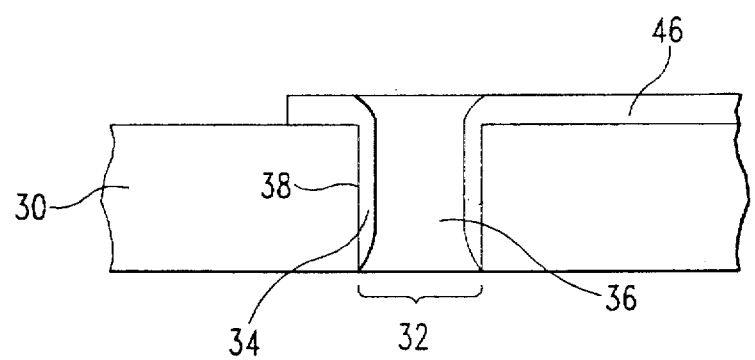
FIG. 3 is a cross-sectional view of another embodiment of the invention wherein two different metallurgies are provided in a single via in order to provide better adhesion and conductivity of the via.

Referring now to FIG. 3, there is shown another embodiment of the present invention. An aluminum nitride sintered body 30 contains at least one via 38 which is filled with graded metallurgy, generally indicated by 32. First layer of metallurgy 34 adheres to the walls of the via 38 but leaves an open central portion of the via 38 which is filled by second layer of metallurgy 36. First and second layers of metallurgy 34, 36 together make up graded metallurgy 32. The compositions of the first and second layers of metallurgy 34, 36 are the same as those discussed above.

In the prior art, where the via metallization did not adhere well to the walls of the via, the vias could "rattle around" or move around within the via, which could lead to cracking around the via. Accordingly, the present inventors have proposed a graded metallurgy for the via which has several advantages. The first is that rattling vias are prevented. The second is that the first layer of metallurgy provides good adhesion to the walls of the via. And the third is that the second layer of metallurgy, while being tightly adhered to the first layer of metallurgy, provides a highly conductive core for the transmittance of power and signals.

The embodiment of FIG. 3 may be made by filling the via of an unsintered aluminum nitride body with graded metallurgy paste. This can be accomplished by first applying a metallurgy paste to the via corresponding to the composition of the first layer of metallurgy paste. A low viscosity paste is used for this purpose. The metallurgy paste is then allowed to dry, with the result that the metallurgy paste shrinks in volume and adheres only to the walls of the via. Thus, a central portion of the via is left without or devoid of paste. Then, a second metallurgy paste, corresponding to the composition of the second layer of metallurgy paste is applied to the via so as to fill the central portion of the via left vacant by the first layer of metallurgy paste. Then, the unsintered aluminum nitride body and via with graded metallurgy paste is sintered as described above to result in the structure as shown in FIG. 3.

Figure 4:
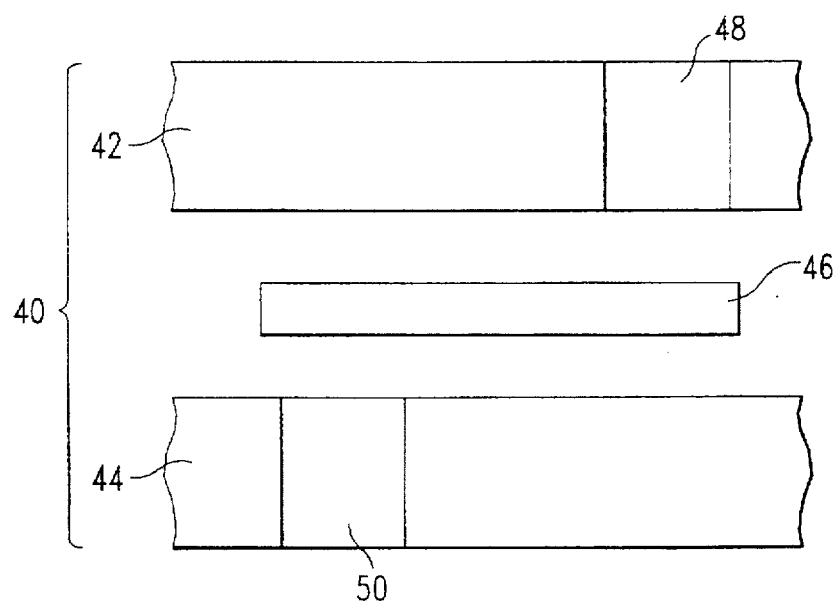
FIG. 4 is a cross-sectional view of a further embodiment of the invention wherein a metallurgical feature of the composition according to the present invention is provided between two layers of sintered aluminum nitride.

Referring now to FIG. 4, there is disclosed the last embodiment of the present invention. There is a multilayered aluminum nitride sintered body, generally indicated by 40. For ease of illustration, the various layers of the sintered body 40 are shown separated. The multilayered aluminum nitride sintered body 40 comprises at least two sintered layers 42, 44 of aluminum nitride and at least one metallurgical feature 46 situated between the two sintered layers 42, 44 of aluminum nitride. The composition of the metallurgical feature 46 comprises 30 to 60 volume percent aluminum nitride and 40 to 70 volume percent of tungsten or molybdenum or a mixture of tungsten and molybdenum, preferably tungsten. The metallurgical feature 46 may be a wiring line to connect via 50 in sintered layer 44 to via 48 in sintered layer 42. In addition, metallurgical feature 46 may be used in conjunction with vias having graded metallurgy as shown in FIG. 3. Alternatively, metallurgical feature 46 may form a power plane or ground plane. Power and ground planes contain a substantial quantity of metallization in a single layer and can suffer from delamination due to poor adhesion to the adjoining ceramic layers. By making the power and/or ground planes from the composition of the metallurgical feature 46, better adhesion can result without a significant decrease in electrical performance of the power and/or ground planes.

EXAMPLES

Peel Test Results:

Six aluminum nitride multilayer substrates were prepared. Each of the substrates consisted of 3 weight percent yttria (1–5 μ particle size), 1 weight percent calcia-alumina-boria glass (4–8 μ particle size), remainder aluminum nitride (1–1.5 μ aggregate particle size). Paste was screened on to form nine pads on each substrate. Four of the substrates received first and second layers of tungsten (1–3 μ particle size) metallurgical paste, denoted in the Table as pastes I and II, respectively. Two of the substrates received only the second layer of metallurgical paste (paste II). Generally speaking, the smaller the particle sizes for the yttria, calcia-alumina-boria glass, aluminum nitride and metallic particles are preferred for enhanced densification.

After undergoing binder burnoff, the substrates were sintered at 1600 degrees Centigrade for 10–28 hours. Wires were then soldered to the pads with Cu/Sn solder (66 weight percent copper; 34 weight percent tin) and pulled at an angle of 90 degrees with respect to the pads.

The average peeling load for those substrates containing first and second layers of metallurgy (pastes I and II) was 3.6 to 4.2 pounds. All failures occurred between the solder and pad. There were no fails between the pad and ceramic.

The average peeling load for those substrates containing only the second layer of metallurgy (paste II) was 1.1 to 1.4 pounds. All the failures occurred at the ceramic/pad interface, which is extremely undesirable.

TABLE

| METALLURGY PASTES COMPOSITION (Volume %) | | |
|---|---|---|
| COMPONENT | PASTE I | PASTE II |
| SOLIDS | | 31 |
| Tungsten | 15 | |
| Aluminum Nitride | 18 | |
| Cab* Glass | <.5 | |
| Yttria | <.5 | |
| Total Solvent | 51 | 51 |
| Total Non-Solvent Organics | 15 | 18 |

*calcia-alumina-boria

I/O PIN PULL TESTS RESULTS:

An additional 6 substrates were prepared in the manner as described above except that 168 I/O pads were screened on each substrate. As was done above, the pads on four of the substrates were screened with first and second metallurgical pastes (pastes I and II) while the pads on two of the substrates were screened with second metallurgical paste (paste II) only.

After sintering as above, I/O pins were brazed to the pads with Cu/Ag braze. The pins were then pulled at an angle of 70 degrees with respect to the pads.

The results indicate that the substrates with first and second layers of metallurgy experienced no pad failures. All failures were pin shank fails at 18 pounds. The substrates with only the second layer of metallurgy failed at 5 to 18 pounds; 1–2% of the pads failed through pad delamination.

ZYGLO PENETRATION RESULTS:

Several of the substrates above were exposed to Zyglo penetrant and then sectioned. Those substrates having first and second layers of metallurgy exhibited no Zyglo penetration while those substrates having only the second layer of metallurgy exhibited Zyglo penetration at the ceramic/pad interface indicating partial delamination sintering.

These results indicate the advantages of using graded metallurgy rather just a single layer of tungsten or molybdenum metallurgy.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for producing an aluminum nitride sintered body having graded metallurgy comprising the steps of:

providing an aluminum nitride unsintered body having at least one via therein;

forming a first layer of metallurgy paste proximate to said at least one via and in direct contact with said aluminum nitride body, said first layer of metallurgy paste comprising, based on the solids content of said paste, 30 to 60 volume percent aluminum nitride and 40 to 70 volume percent of a metal selected from the group consisting of tungsten, molybdenum and mixtures thereof;

forming a second layer of metallurgy paste in direct contact with, and that completely covers, said first layer of metallurgy paste, said second layer of metallurgy paste, based on the solids content of said paste, comprising 90 to 100 volume percent of a metal selected from the group consisting of tungsten, molybdenum, and mixtures thereof, and 0 to 10 volume percent of aluminum nitride; and sintering said aluminum nitride body and said first and second layers of metallurgy paste at a predetermined time and temperature to form a fully dense aluminum nitride sintered body having first and second layers of graded metallurgy wherein said second layer of metallurgy completely covers said first layer of metallurgy and wherein said graded metallurgy is in direct contact with said at least one via.

2. The method of claim 1 wherein said first layer of metallurgy is in direct contact with said at least one via.

3. The method of claim 1 wherein said first layer of metallurgy is positioned around said at least one via but is not in contact therewith and said second layer of metallurgy is in direct contact with said at least one via.

4. The method of claim 1 wherein said first layer of metallurgy further comprises a sintering aid.

5. The method of claim 1 wherein said metal in said first and second layers is tungsten.

6. The method of claim 1 wherein said second layer of metallurgy is 100 volume percent metal.

7. The method of claim 6 wherein said metal is tungsten.

8. A method for producing a co-fired aluminum nitride sintered body having adherent graded metallurgy comprising the steps of:

provided an aluminum nitride unsintered body;

forming a first layer of metallurgy paste in direct contact with said aluminum nitride body, said first layer of metallurgy paste comprising, based on the solids content of said paste, 30 to 60 volume percent aluminum nitride and 40 to 70 volume percent of a metal selected from the group consisting of tungsten, molybdenum and mixtures thereof;

forming a second layer of metallurgy paste in direct contact with, and that completely covers, said first layer of metallurgy paste, said second layer of metallurgy paste, based on the solids content of said paste, comprising 90 to 100 volume percent of a metal selected from the group consisting of tungsten, molybdenum, and mixtures thereof, and 0 to 10 volume percent of aluminum nitride; and sintering said aluminum nitride body and said first and second layers of metallurgy paste at a predetermined time and temperature to form a fully dense co-fired aluminum nitride sintered body having first and second layers of graded metallurgy wherein said second layer of metallurgy completely covers said first layer of metallurgy and wherein said graded metallurgy is in direct contact with, and adherent to, said aluminum nitride sintered body.

9. The method of claim 8 wherein said first layer of metallurgy further comprises a sintering aid.

10. The method of claim 8 wherein said metal is tungsten.

11. The method of claim 8 wherein said second layer of metallurgy is 100 volume percent metal.

12. The method of claim 11 wherein said metal is tungsten.

* * * * *